(12) United States Patent
Chu et al.

(10) Patent No.: US 9,096,420 B2
(45) Date of Patent: Aug. 4, 2015

(54) METHODS AND APPARATUS FOR MEMS DEVICES WITH INCREASED SENSITIVITY

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 89 days.

(21) Appl. No.: 13/790,617

(22) Filed: Mar. 8, 2013

(65) Prior Publication Data
US 2014/0252358 A1     Sep. 11, 2014

(51) Int. Cl.
*H01L 27/14*     (2006.01)
*B81B 3/00*      (2006.01)
*B81C 1/00*      (2006.01)

(52) U.S. Cl.
CPC ........... *B81B 3/0059* (2013.01); *B81C 1/00158* (2013.01)

(58) Field of Classification Search
None
See application file for complete search history.

(56) References Cited

U.S. PATENT DOCUMENTS

| 2011/0115038 A1* | 5/2011 | Kanemoto | 257/418 |
| 2013/0220016 A1* | 8/2013 | Simoni et al. | 73/514.32 |

\* cited by examiner

*Primary Examiner* — Sonya D McCall Shepard
(74) *Attorney, Agent, or Firm* — Slater & Matsil, L.L.P.

(57) ABSTRACT

Methods and apparatus for forming MEMS devices. An apparatus includes at least a portion of a semiconductor substrate having a first thickness and patterned to form a moveable mass; a moving sense electrode forming the first plate of a first capacitance; at least one anchor patterned from the semiconductor substrate and having a portion that forms the second plate of the first capacitance and spaced by a first gap from the first plate; a layer of semiconductor material of a second thickness patterned to form a first electrode forming a first plate of a second capacitance and further patterned to form a second electrode overlying the at least one anchor and forming a second plate spaced by a second gap that is less than the first gap; wherein a total capacitance is formed that is the sum of the first capacitance and the second capacitance. Methods are disclosed.

20 Claims, 6 Drawing Sheets

US 9,096,420 B2

METHODS AND APPARATUS FOR MEMS DEVICES WITH INCREASED SENSITIVITY

TECHNICAL FIELD

The present invention relates generally to microelectromechanical systems (MEMS) devices, which includes microstructures formed on a substrate such as a semiconductor wafer, the micro-structures may form proof masses, for example, for use in gyroscopes for sensing changes in angular velocity, in accelerometers for sensing changes in linear velocity, and in sensing and analog and digital processing.

BACKGROUND

A MEMS sensor such as a gyroscope or accelerometer formed in a semiconductor process requires forming a movable structure with a certain mass. A relatively thick layer is provided and patterned to form a proof mass that is coupled to the remaining structures by flexible supports, which allow the mass to move in certain directions. Anchor structures are formed and some of the flexible supports are coupled to the anchor structures. The mass and the anchors, or sensing electrodes coupled to them, have portions that form plates of a variable capacitance. When the mass is displaced by motion, some of the capacitances increase and some decrease, depending on the direction of motion. By sensing the changes in the capacitances, an electrical signal that corresponds to the motion can be output. The gap spacing between the capacitive plates formed on or coupled to the mass and those of the anchors determines in part the characteristics of the capacitance. In prior approaches, this gap spacing is limited by the characteristics of an etch process used to form the structure, limiting the ability to form MEMS structures with the gap spacing needed to provide the required sensitivity in the MEMS device.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

Figure 1:
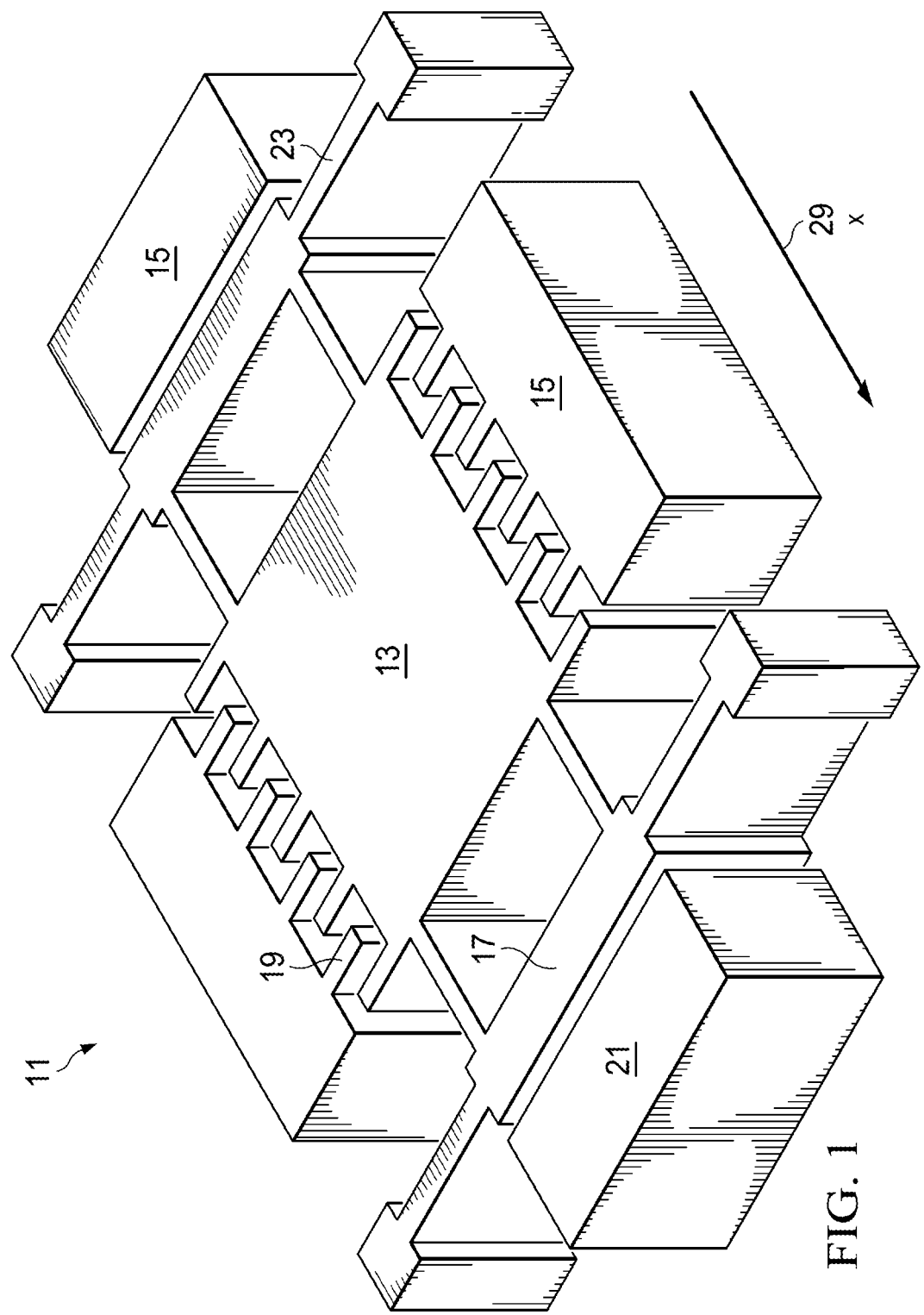
FIG. 1 illustrates in a projection a MEMS device for use in describing the embodiments.

FIG. 1 illustrates, in a simplified projection, a MEMS device 11 that includes a mass 13 formed in a layer of semiconductor material. Springs 23 are formed supporting the mass 13 while allowing it to move in at least one direction, as shown by the arrow 29 illustrating movement in a direction 'x'. Anchors 15 are formed of the same layer of semiconductor material proximate to the mass 13 and supporting the springs 23, for example. A moving sense electrode 17 is shown attached to the mass 13 and spaced from it. In alternative embodiments moving sense electrode 17 may be formed as a portion of mass 13. A fixed sense electrode 21 is formed as a portion of an anchor and forms a first plate of a capacitance with the vertical surface of the moving sense electrode 17 forming the other plate of the capacitance. The plates of the capacitance between the sense electrodes 17 and 21 are spaced by a gap that is formed in an etch process.

The gap between the plates is a characteristic of the capacitance formed between the electrodes 17 and 21 and should be kept to a small distance to increase the sensitivity of the capacitive sensing. However, in the semiconductor etch process of the semiconductor layer, here for example an etch process such as a deep RIE etch, the gap in a thick layer of semiconductor material is limited to a certain aspect ratio. As the thickness of the layer increases, the gap between the structures formed in the etch process also increases, limiting the ability to design a device with a desired gap. Thus, as the layer thickness is increased to provide the necessary mass for the proof mass, the minimum gap distance that can be formed in the etch process also increases.

Processes for forming MEMS devices in a semiconductor layer that can be used with the embodiments are described in U.S. patent application Ser. No. 12/658,867, entitled "MEMS Devices and Fabrication Methods Thereof," filed Oct. 12, 2012, which is hereby incorporated by reference herein in its entirety.

Figure 2:
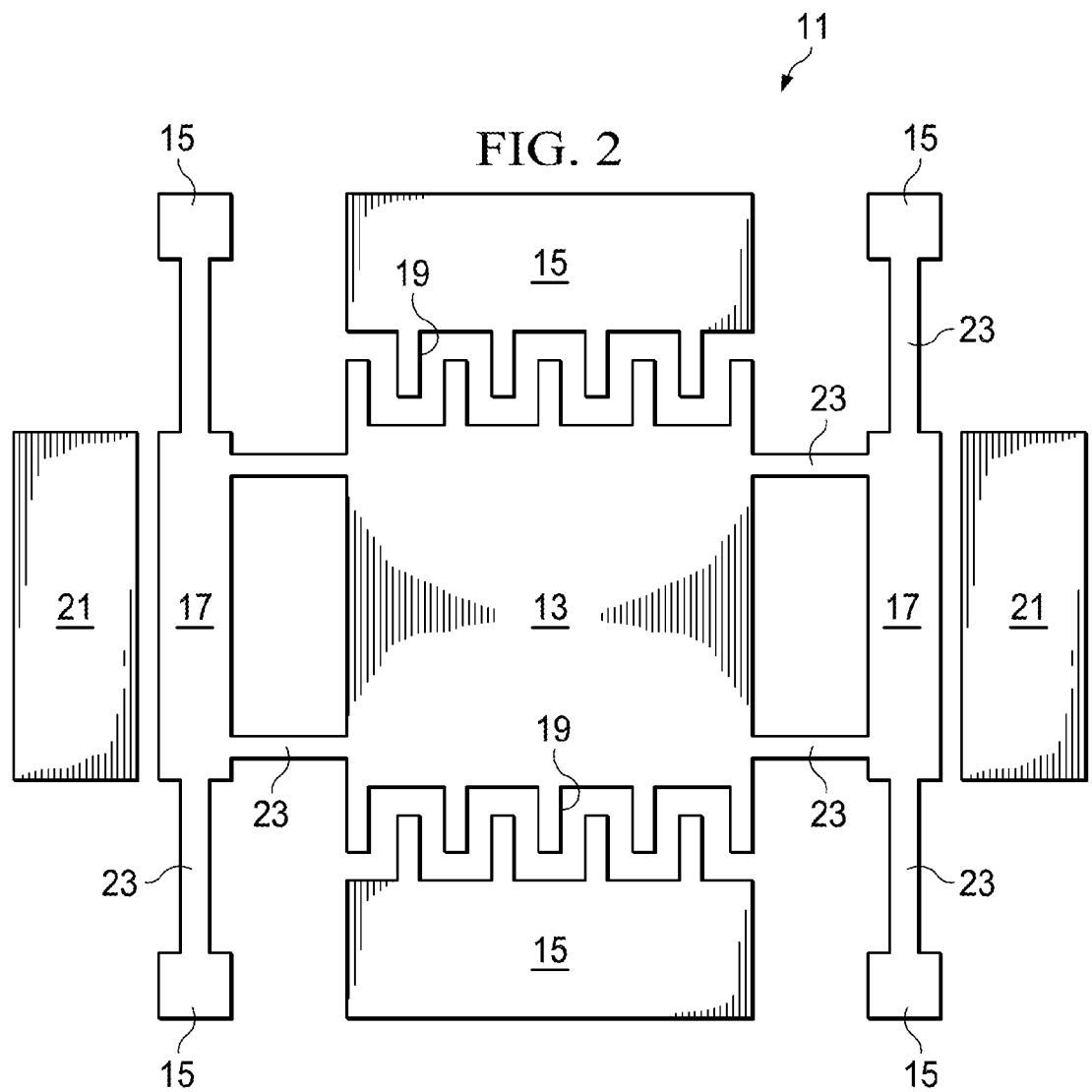
FIG. 2 illustrates in a plan view the MEMS device of FIG. 1.

FIG. 2 illustrates, in a plan view, the device 11 of FIG. 1. Like reference, numerals are used for like elements in the figures and so, no further explanation is provided herein. The structure including mass 13 and the anchors may be formed, for example, in a wafer bonding process as described in the above incorporated patent application, where a silicon substrate or wafer is patterned and etched to form the layer that includes the device 11, and this structure is bonded to a carrier device that is also patterned to include an air gap or void to be placed beneath the inertia mass 13. In this manner, after a sacrificial oxide is removed, the mass 13 is "release" so that it may move in the completed device.

Alternative embodiments include forming the device 11 in polysilicon layer that is deposited on a semiconductor substrate, and then the polysilicon layer is patterned and etched to form the mass, supports and anchors.

Figure 3:
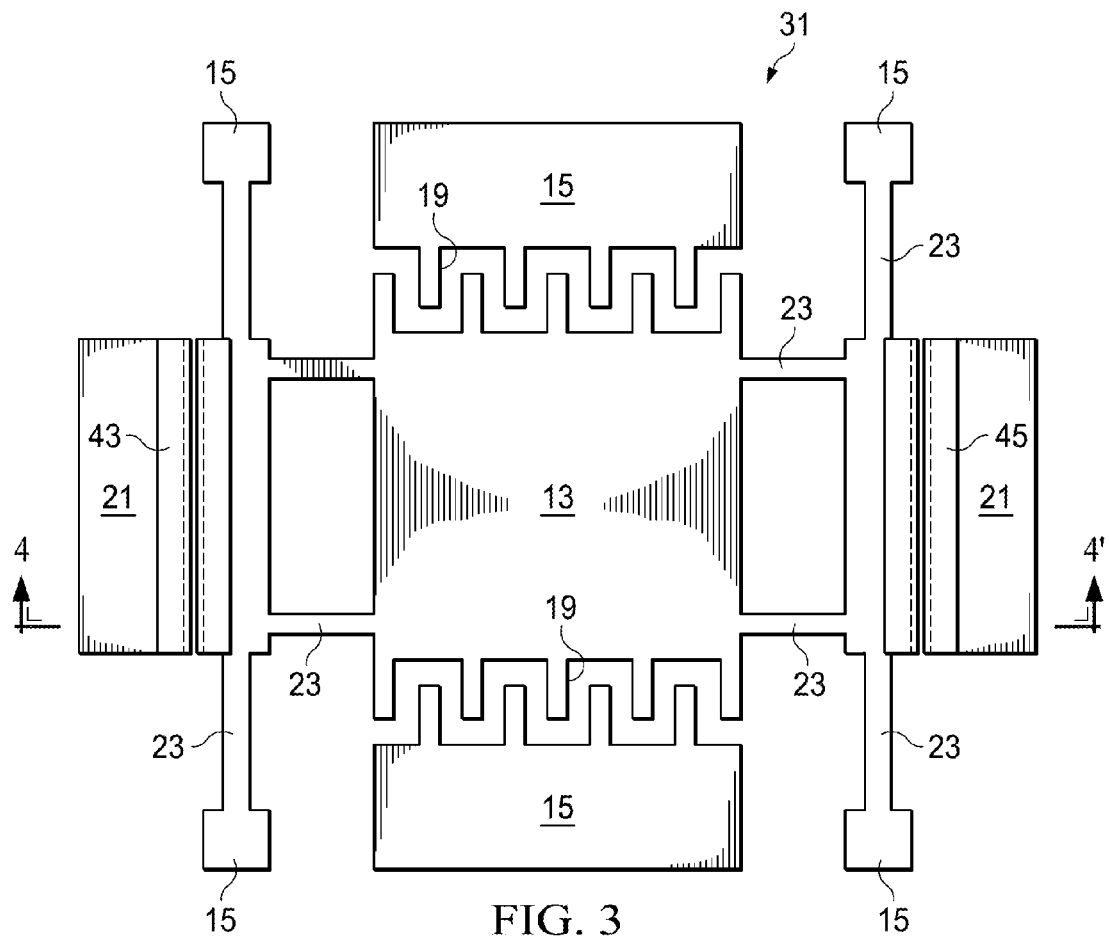
FIG. 3 illustrates in a plan view an example embodiment MEMS device.

FIG. 3 depicts an illustrative example embodiment in a top view. In FIG. 3, device 31 includes the mass 13 of FIGS. 1 and 2, and the anchors 15, but in addition, additional sensing electrodes, a second fixed electrode 43 and a second moving electrode 45, are formed in another layer overlying the electrodes 17 and 21 of the prior figures. The additional electrodes are formed of a second layer of semiconductor material that is deposited over the device 11, and is electrically and physically coupled to it, for example by conductive vias such as openings between the semiconductor layers that are filled with a conductor, or by trench openings filled with a conductor. The second electrodes 43 and 45 may be formed, in an embodiment, by depositing a layer of polysilicon over the structure 11 and using pattern and etch to form the electrodes 43 and 45. Dielectric layers may separate the structure 11 from the polysilicon layer, these may be removed by etch to release the moving electrode 45 so that its motion corresponds to motion of the moving electrode 17.

Figure 4:
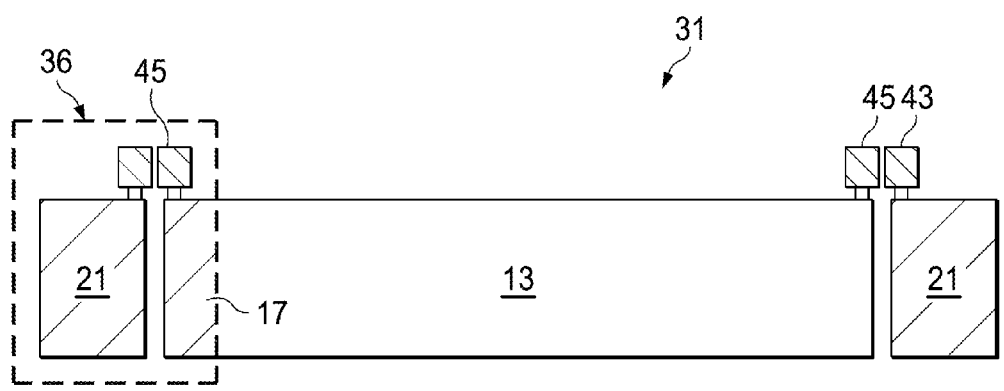
FIG. 4 illustrates in a cross-sectional view a portion of the embodiment of FIG. 3.

FIG. 4 depicts, in a cross sectional view, the device 31 along the cross section line 4-4' shown in FIG. 3. In FIG. 4, the mass 13 has fixed anchor electrode 21 and moving electrode 17 in a first layer, and a second moving electrode 45 and a second fixed electrode 43, in a second layer formed over the first layer and coupled to the moving electrode 17 and the fixed electrode 21, as shown.

Figure 5:
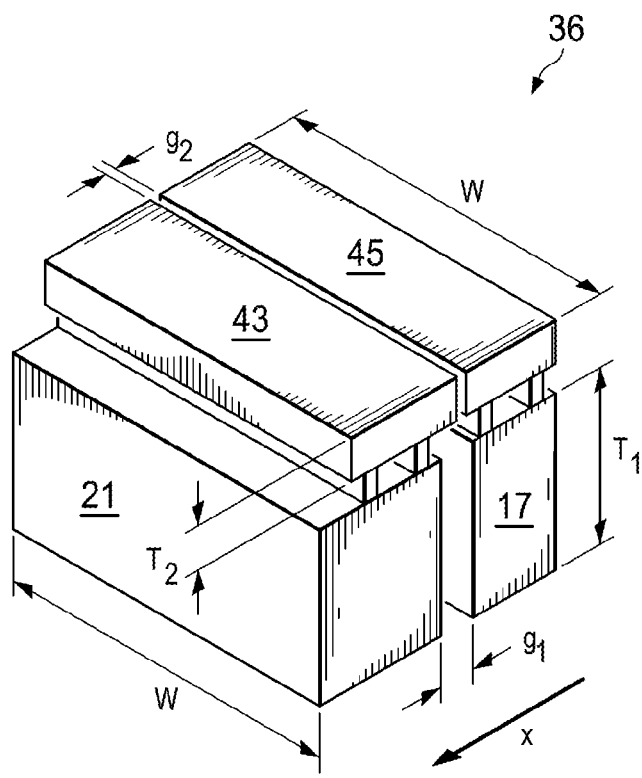
FIG. 5 illustrates in a projection a magnified portion of the embodiment of FIG. 4.

FIG. 5 illustrates, in a magnified simplified projection view, the operation of the sensing electrodes in area 36 of FIG. 4. In FIG. 5, the first layer of semiconductor material has a thickness $T_1$, a width W, and the gap between the moving electrode 17 and the anchor electrode 21 is given by a distance $g_1$. The second layer of semiconductor material has a thickness $T_2$ and includes second moving electrode 45, that is formed overlying the top surface of the moving electrode 17, and second fixed electrode 43, that is formed overlying the top surface of the fixed electrode 21. A capacitance $C_1$ is formed by plates that are the surfaces of the electrodes 17 and 21, and a capacitance $C_2$ is formed by the plates formed by the sides of the second fixed electrode 43, and the second moving electrode 45. When the mass 13 (not shown in FIG. 5) and the moving electrodes 17 and 45 are displaced by a distance x, the capacitances $C_1$ and $C_2$ will vary.

The capacitance $C_1$ is given by:

$$C_1 = \frac{\varepsilon T_1 W}{g_1}. \quad \text{Equation 1}$$

The change in the capacitance $C_1$ due to a displacement x as shown in FIG. 5 is then given by:

$$\Delta C_1 = \frac{\varepsilon T_1 W}{(g_1 - x)} - \frac{\varepsilon T_1 W}{g_1} \cong C_1 \frac{x}{g_1}. \quad \text{Equation 2}$$

In the embodiments illustrated in FIGS. 3-5, an additional layer of semiconductor material is formed over the first layer, but having a thickness $T_2$ that is less than thickness $T_1$, as shown in FIG. 5.

The relationship between the thicknesses $T_1$ and $T_2$, and the spacing gaps $g_1$, and $g_2$, can be expressed as:

$$T_1 = n_1 T_1 \, n_1 \geq 1$$

$$g_1 = n_2 g_2 \, n_2 \geq 1 \quad \text{Equation 3.}$$

The capacitance $C_2$, in the second layer, can be expressed as:

$$C_2 = \frac{\varepsilon T_2 W}{g_2} = \frac{n_2 \varepsilon T_1 W}{n_1 g_1} = \frac{n_2}{n_1} C_1. \quad \text{Equation 4}$$

The change in the capacitance $C_2$ due to a displacement x can be expressed as:

$$\Delta C_2 \cong C_2 \frac{x}{g_2} = \frac{n_2^2}{n_1} C_1 \frac{x}{g_1} = \frac{n_2^2}{n_1} \Delta C_1. \quad \text{Equation 5}$$

In the embodiments, a second capacitance is formed over (or alternatively, in another embodiment not shown, under) the first capacitance. The total change in capacitance due to a displacement x is given by the sum:

$$\Delta C_{total-12} = \Delta C_1 + \Delta C_1 = \left(1 + \frac{n_2^2}{n_1}\right) \Delta C_1. \quad \text{Equation 6}$$

To illustrate the improved performance obtained by using the second layer having a lesser thickness and with the smaller gap distance in the embodiments, it is necessary to compare the performance of the embodiments to a single layer structure of the combined thickness of the two layers, $T_1+T_2$, with the single larger gap $g_1$. The capacitance $C_3$ for a second layer with the larger gap distance g1 can be expressed as:

$$C_3 = \frac{\varepsilon T_2 W}{g_1} = \frac{\varepsilon T_1 W}{n_1 g_1} = \frac{1}{n_1} C_1. \quad \text{Equation 7}$$

The change in the capacitance $C_3$ due to the displacement x may be expressed as:

$$\Delta C_3 \cong C_3 \frac{x}{g_1} = \frac{1}{n_1} C_1 \frac{x}{g_1} = \frac{1}{n_1} \Delta C_1. \quad \text{Equation 8}$$

A comparison of the capacitance change obtained using the smaller gap distance $g_2$ in the second layer of thickness $T_2$, to a single layer with the gap distance $g_1$, may be expressed as:

$$\frac{\Delta C_{total-12}}{\Delta C_{total-12}} = \frac{\left(1 + \frac{n_2^2}{n_1}\right) \Delta C_1}{\left(1 + \frac{1}{n_1}\right) \Delta C_1} = \frac{n_1 + n_2^2}{n_1 + 1}. \quad \text{Equation 9}$$

In an example illustrative embodiment, if an etch process is used to form the two layers having the same etch aspect ratio for each layer, so that the ratio $T_1/g_1 = T_2/g_2$; then $n_1$ (recall $T_1 = n_1 T_2$), and $n_2$, (recall $g_1 = n_2 g_2$), will be equal, In this example, the ratio above may be simplified as:

$$\frac{\Delta C_{total-12}}{\Delta C_{total-13}} = \frac{n_1 + n_2^2}{n_1 + 1} = n_1. \quad \text{Equation 10}$$

Equation 10 then indicates that the embodiments will have increased sensitivity, that is the change in capacitance for a displacement x will be greater than the sensitivity obtained using prior approaches, so long as $n_1$ is greater than 1. Consider as an illustrative example where the thickness $T_1$=40 microns and $g_1$=2 microns, with the same aspect ratio, $T_1$=8 microns, and g2=0.4 microns. In this example, $n_1 = n_2 = 5$.

Thus, the capacitance change of the embodiments, with the smaller gap $g_2$ in the second, thinner layer, is increased 5 times over the same thickness in a single layer with the larger gap $g_1$. In various example embodiments, the first thickness T1 can be between 5 to about 60 microns, the second thickness T2 can be between 1 and about 10 microns, the first g1 can be between about 0.5 to about 3 microns, and the second gap g2 can be between about 0.05 and 1 microns. The aspect ratio for etch processes that can be used with the embodiments can be between about 15 and up to about 30.

Because of the fixed aspect ratio characteristics of the etch processes, a thinner layer can have a correspondingly smaller gap g between patterned features. Forming the second layer of a thickness $T_2$ that is less than the thickness $T_1$ allows the smaller gap $g_2$ to be formed using the same etching process; and by use of the embodiments, the change in capacitance for a displacement x, (that is the sensitivity), is greatly increased.

In a non-limiting illustrative embodiment, the gap $g_1$ is the minimum gap distance that the etch process can form for the thickness $T_1$ in the first layer. However, improvement in the capacitive sensing (improved sensitivity to a displacement of the mass) will be achieved in any embodiment where the second layer has a smaller gap $g_2$ than the gap $g_1$ in the first layer as described above, even if the gap $g_2$ is not the minimum size that can be formed by the etch processes used.

Referring to another example, consider the operation of Equation 9 above in a different case where the etching characteristics for the two layers, the first layer having thickness $T_1$, and the second layer $T_2$, are not the same. That is, the same etching aspect ratio is not obtained, perhaps because the two layers are of different materials, or because the two etching processes are different. In this example, if $g_2$ is less than $g_1$ ($n_2$ and $n_1$ are greater than 1) then the capacitance change obtained by use of the embodiments is still advantageously increased over the example of a prior approach having a single layer with a gap $g_1$.

For an illustrative example of this situation, if the thickness of the first layer, $T_1$, is 40 microns and gap $g_1$ is 2 microns, so that the aspect ratio of the first layer is "20", and the thickness of the second thinner layer, $T_2$, is 8 microns, and the gap $g_2$ is 0.5 um, so that the aspect ratio is "16", then $n_1$ is 5, and $n_2$ is 4; by substitution, Equation 9 then shows that the change in capacitance for a displacement x is 3.5 greater by use of the embodiments: (5+16)/6=21/6=3.5.

In the embodiments illustrated in FIGS. 3-5 above, the second layer of semiconductor material is illustrated in non-limiting examples as being formed over an upper surface of the first layer that includes the moveable mass 13 and the first moving electrodes and the first fixed electrodes. Note that in an alternative embodiment the second layer may be formed beneath or underlying the first layer, that is, the embodiments require a layer of a thickness $T_2$ with a gap $g_2$ that is less than the gap $g_1$ for the first layer, but the second layer can be underneath, or overlying, the first layer; the equations above still express the relationships and the sensitivity in the capacitance sensing is still increased as described above. The relative positions as shown are for illustration and are not limiting and rotating the devices does not change the relationships between them.

Figure 6:
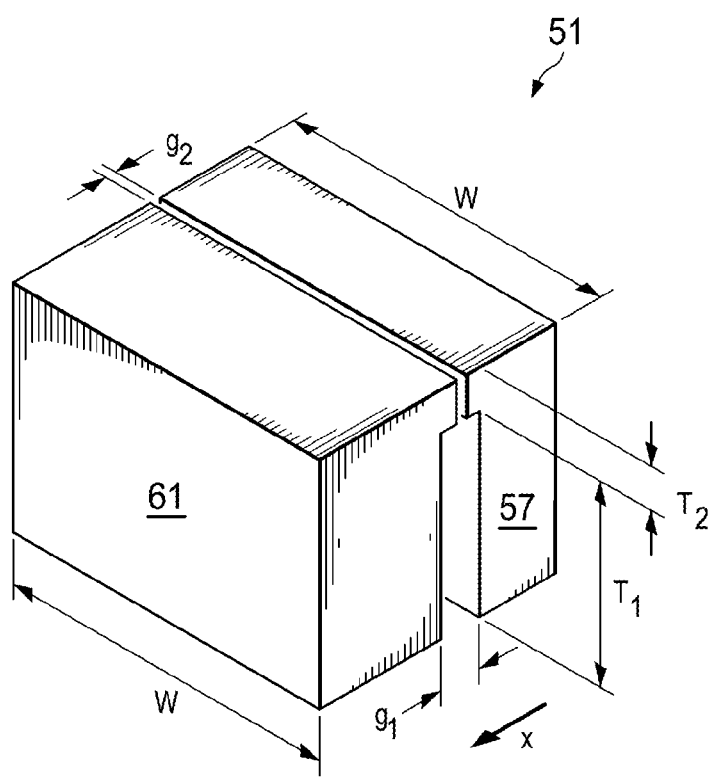
FIG. 6 illustrates in another projection an alternative embodiment.

FIG. 6 depicts an alternative embodiment in another simplified projection. In FIG. 6, a device 51 is shown in a magnified view of a portion of a moving electrode 57 and a fixed electrode 61. Moving electrode 57 is part of, or alternatively physically coupled to, a moveable mass such as a proof mass (not visible in FIG. 6). Fixed electrode 61 is part of, for example, an anchor structure as shown in FIGS. 1-5 above. However, in this alternative embodiment, instead of forming two separate layers with a first thickness $T_1$ and a second thickness $T_2$, a single layer of material is used, but is patterned to form a portion of thickness $T_2$ with a gap $g_2$ that is less than the gap $g_1$ for a portion having thickness $T_1$. If gap $g_1$ and thickness $T_1$ are both respectively greater than the gap $g_2$, and the thickness $T_2$, then $n_1$ and $n_2$, in Equation 3 above, are greater than 1, and so the capacitance change that is sensed will be increased, as shown by Equation 9, above.

An example process for forming the MEMS embodiments described above is provided in U.S. patent application Ser. No. 13/650,897, entitled "MEMS Devices and Fabrication Methods Thereof", incorporated by reference above. FIGS. 7-13 illustrate an embodiment process applied to an intermediate stage MEMS device for illustration of the processes that may be used.

Figure 7:
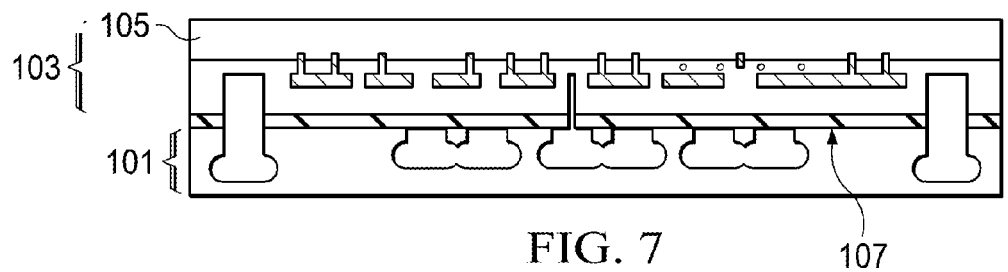
FIG. 7 illustrates in a cross sectional view, a MEMS device at an intermediate process stage, to illustrate a process for forming the embodiments.

In FIG. 7, a carrier 101, which may be for example a semiconductor substrate, is shown with a MEMS device 103 bonded to it at a bonding interface 107. The MEMS device 103 includes a substrate 105 that has dielectric and polysilicon layers formed on the lower surface as oriented in FIG. 7, this surface is bonded to the carrier 101 at bonding interface 107. In an embodiment, carrier 101 may be a silicon wafer. In alternative embodiments, carrier 101 may be formed of a quartz substrate or a ceramic substrate. The substrate 105 may be a silicon wafer. In alternative embodiments the substrate 105 may be another semiconductor material such as germanium or gallium arsenide, and may be a silicon-on-insulator (SOI) wafer. In addition, either the carrier 103 or substrate 105, or both, may include additional active or passive devices (not shown) in portions that are not illustrated to form highly integrated circuit devices.

MEMS substrate 105 is shown with additional oxide and polysilicon layers to form MEMS device 103 and having a lower surface, as oriented in FIG. 7, bonded to the carrier 101 at a bonding interface 107. The bonding may be implemented by fusion bonding, wafer bonding, eutectic bonding, and may include direct bonding, glue bonding, thermo-compression bonding, or the like.

Figure 8:
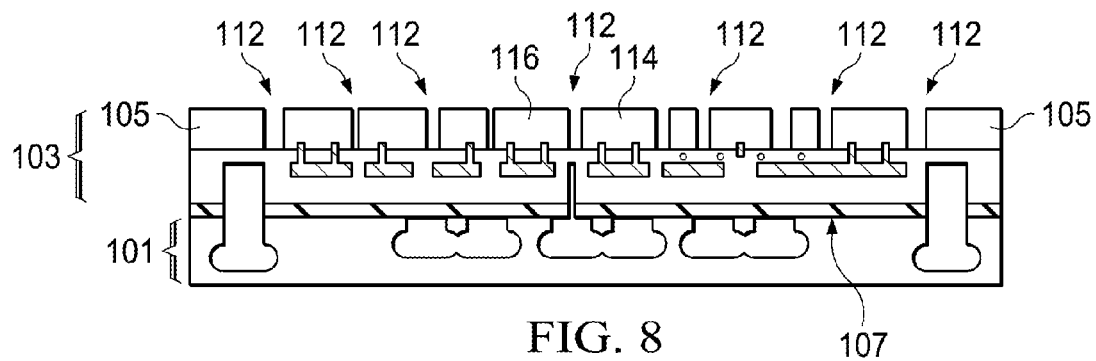
FIGS. 8-13 illustrate in cross sectional views the MEMS device of FIG. 7, following the completion of additional process steps.

FIG. 8 depicts in another cross sectional view the MEMS device 103 and carrier 101 of FIG. 7 following additional process steps. In FIG. 8, the upper surface of MEMS substrate 105 has been patterned and etched. A thinning process, such as by an etch or grinding operation, is performed on the top surface of the MEMS device 103. The grinding is performed until a desired thickness is achieved. In accordance with an embodiment, the MEMS device is of a thickness in a range from about 5 um to about 60 um.

An etch step is then performed to etch through substrate 105 of the MEMS device 103 to form through-openings 112 in accordance with an embodiment. Photolithographic techniques that may be used include deposition of a photoresist layer, exposure, developing and patterning using the photoresist as an etch mask. The etch used may be deep reactive ion etching (DRIE) for example. Through-openings, 112 may physically and electrically isolate some portions (e.g., portion 114) of substrate 105 from other portions (e.g., portion 116) of the substrate 105.

Figure 9:
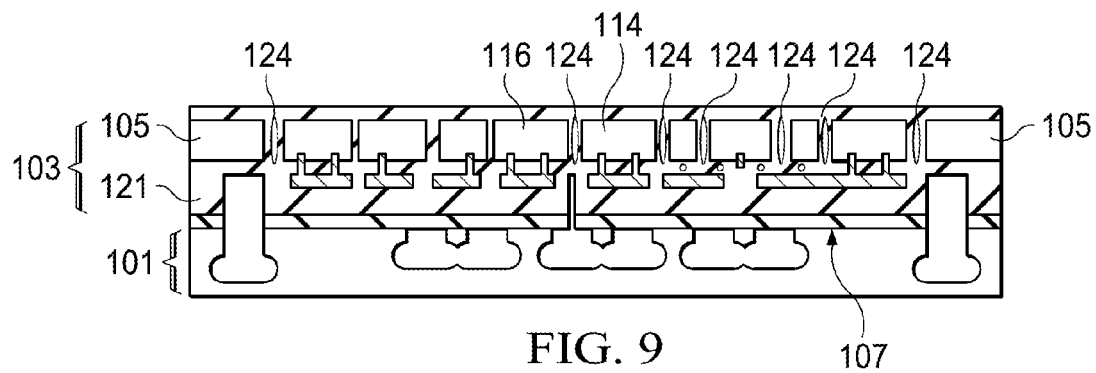

FIG. 9 illustrates a cross sectional view of the semiconductor device shown in FIG. 8 after an oxide deposition is applied to the substrate 105 in accordance with an embodiment. The oxide deposition may form a sacrificial oxide layer 121. The sacrificial oxide layer 121 can be formed by any suitable fabrication techniques such as CVD, LPTEOS, PECVD, HDPCVD and the like. It should be noted that the sacrificial oxide layer 121 may be formed through multiple oxide deposition processes and their corresponding etch-back processes.

In addition, as shown in FIG. 9, there may be an air opening 124 formed in the sacrificial oxide layer 121.

The patterning process is employed to form openings in the sacrificial oxide layer 121. The patterning process may be accomplished by depositing a commonly used mask material (not shown) such as photoresist over the sacrificial oxide layer 121. The mask material is then patterned and the sacrificial oxide layer 121 is etched in accordance with the pattern to form the openings 125.

Figure 10:
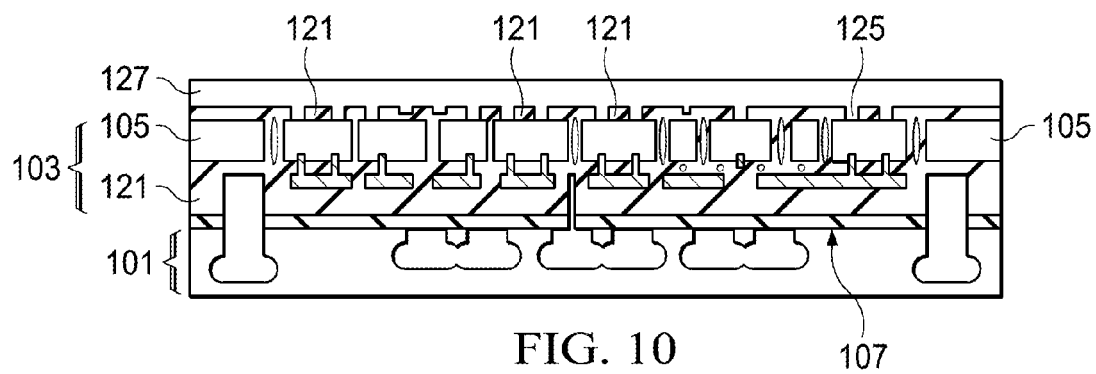

FIG. 10 illustrates the semiconductor device shown in FIG. 9 after the sacrificial oxide 121 is patterned and a polysilicon layer is formed on the sacrificial oxide layer in accordance with an embodiment. A layer of polysilicon 127 is formed over the structure, including within the oxide openings 125. As shown in FIG. 10, the polysilicon layer 127 not only fills the openings 125 in the sacrificial oxide 121, it also covers the top surface of the MEMS device 103.

Figure 11:
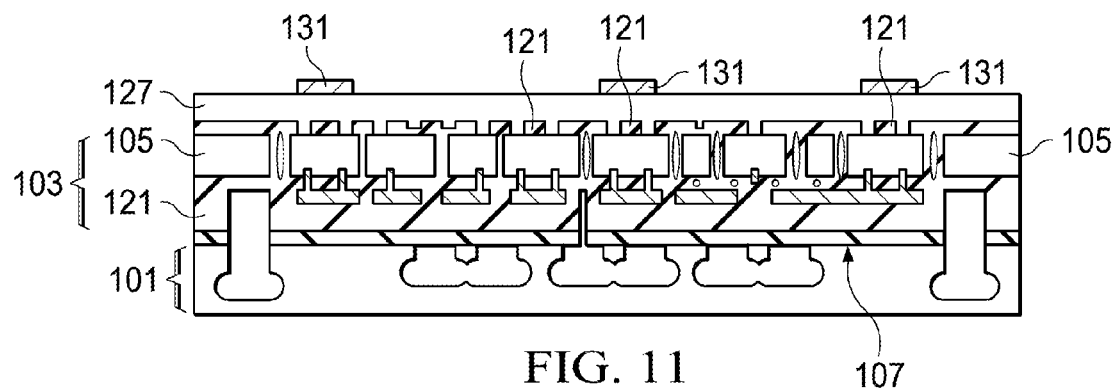

FIG. 11 illustrates the formation and patterning of a bonding material layer on top of the MEMS device 103 in accordance with an embodiment. The bonding material layer 131 may be made of aluminum copper, germanium, gold, the like, or a combination thereof. The bonding material 131 may be formed using PVD and the like. The bonding material 131 may be patterned using photolithography techniques.

Figure 12:
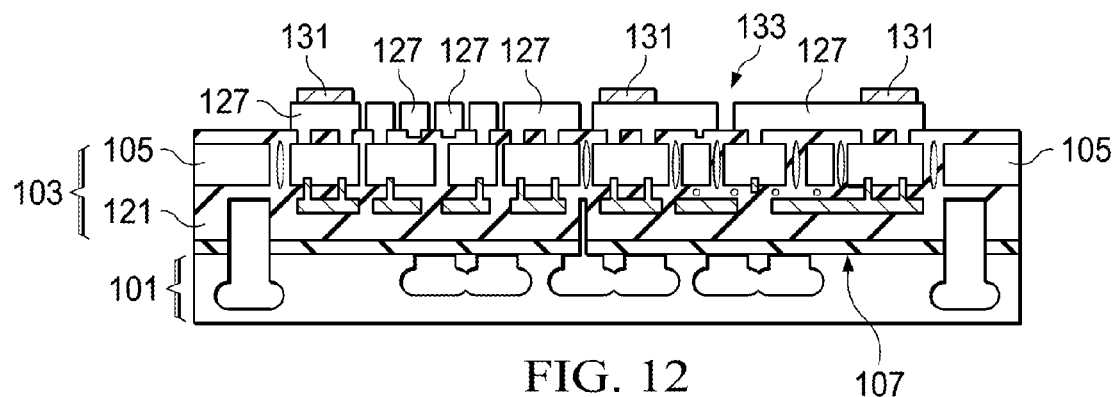

FIG. 12 illustrates a cross sectional view of the semiconductor device shown in FIG. 11 after an etching process is applied to the polysilicon layer 127 in accordance with an embodiment. A patterning process is applied to the polysilicon layer 127 (shown in FIG. 10) by depositing a commonly used mask material (not shown) such as photoresist. The mask material is then patterned and the polysilicon layer 127 is etched back to remove portions of polysilicon layer 127 overlying the MEMS device 103, while leaving portions of polysilicon, and forming openings such as 133.

Figure 13:
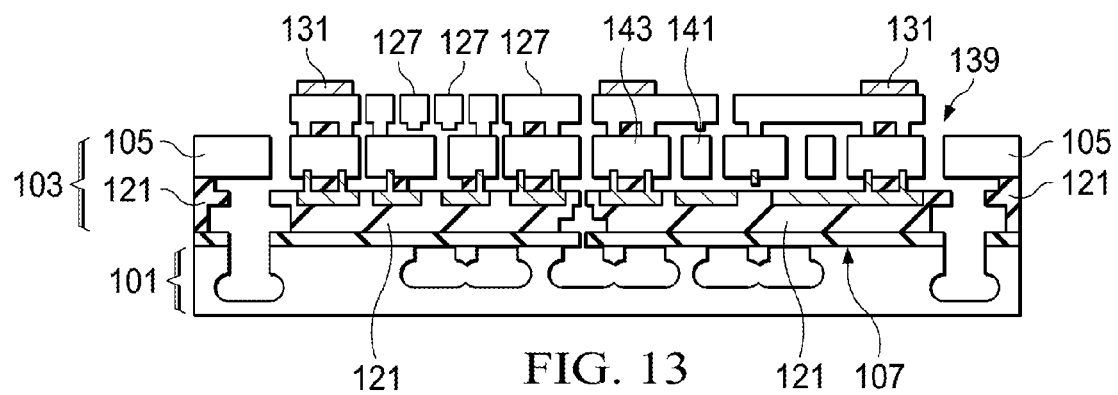

FIG. 13 illustrates a cross sectional view of the semiconductor device shown in FIG. 12 after, in one embodiment, a vapor HF process is applied to the sacrificial oxide layer 121 (shown in FIGS. 9-12). Other methods for removing the sacrificial oxide may also be used. In FIG. 13, opening 139 illustrates an opening formed through substrate 105 where the sacrificial oxide 121 is removed. MEMS substrate portions such as 141 in FIG. 13 are completely released from the sacrificial oxide 121 and are moveable, as they are no longer fixed. Other MEMS substrate portions such as 143 are anchored by polysilicon or oxide portions and are not moveable.

Following the process steps described here with respect to FIGS. 7-13, additional processing steps may be performed to bond a CMOS device wafer, for example, to the upper surface of the MEMS substrate 103 using the bonding material 131. The CMOS device may include processors, analog to digital circuitry and the like formed as active and passive devices, to form a complete system including the carrier 101 and the MEMS device 103.

Use of the embodiments advantageously provides a MEMS device with increased sensitivity. This is achieved by increasing the change in capacitance obtained for a displacement of a moveable mass. The embodiments are obtained using standard materials and existing semiconductor processes and provide a cost effective MEMS device with increased sensitivity, as compared to the prior approaches.

In an embodiment, an apparatus is disclosed including a moveable mass formed from a first layer of semiconductor material of a first thickness, the moveable mass coupled to supports configured to allow movement of the mass in at least one direction, the moveable mass having an upper and lower surface; a first electrode coupled to the moveable mass and forming a first plate of a first capacitance; an anchor formed from the first layer of semiconductor material and having a sidewall spaced from the first plate by a first gap and forming a second plate of the first capacitance; a first sensing electrode formed from a second layer of semiconductor material having a second thickness less than the first thickness and overlying one of the upper and lower surfaces of the first electrode and coupled to the moveable mass, the first sensing electrode forming a first plate of a second capacitance; and a second sensing electrode formed from the second layer of semiconductor material and overlying and coupled to one of the upper and lower surfaces of the anchor, the second sensing electrode forming a second plate of the second capacitance spaced from the first plate of the second capacitance by a second gap that is less than the first gap; wherein a total capacitance that is a sum of the first and second capacitances varies with displacement of the moveable mass.

In a further embodiment, in the above apparatus the first layer of semiconductor material comprises a silicon layer. In another embodiment, in the above apparatus, the first layer of semiconductor material is a portion of a silicon wafer that is bonded to a carrier wafer. In still a further embodiment, in the above apparatus, the first layer of semiconductor material and the second layer of semiconductor material are formed of a same material. In yet another embodiment, the semiconductor material comprises silicon. In still another embodiment, the first layer of semiconductor material comprises a polysilicon layer of the first thickness. In still another embodiment, the second layer comprises a polysilicon layer. In still a further embodiment, the second layer is spaced from the first layer and further comprising conductive vias coupling to the first layer. In another embodiment, the first layer of semiconductor material comprises a silicon layer and the second layer of semiconductor material comprises a polysilicon material. In another embodiment, the ratio of the first thickness to the first gap is approximately equal to the ratio of the second thickness to the second gap.

In an embodiment, a method comprises providing a first layer of semiconductor material having a first thickness; patterning a moveable mass from the first layer of semiconductor material and coupled to supports configured to allow the moveable mass to move in at least one direction, the moveable mass having an upper surface, a lower surface, and at least one portion having a first sidewall forming a first plate of a first capacitance; patterning at least one anchor from the first layer of semiconductor material and forming a second sidewall adjacent to the first sidewall of the moveable mass, the second sidewall forming a second plate of the first capacitance and spaced from the first plate of the first capacitance by a first gap formed by an etching process; depositing a second layer of semiconductor material overlying one of the upper and lower surfaces of the moveable mass and the at least one anchor; and forming a first electrode overlying and coupled to the moveable mass and a second electrode overlying and coupled to the at least one anchor by patterning the second layer of semiconductor material, the first electrode configured to move with the moveable mass and forming a first plate of a second capacitance, and the second electrode coupled to the at least one anchor and forming a second plate of the second capacitance, the first and second plates of the second capacitance spaced by a second gap that is formed by an etching process of the second layer; wherein the second gap is less than the first gap.

In a further embodiment, in the above method providing the first layer comprises providing a silicon layer. In still another embodiment, in the above method, providing the first layer comprises providing a silicon wafer. In still a further embodiment, in the above method, the first gap is a minimum gap that is formed by an etch process having an aspect ratio that is applied to the first layer having the first thickness. In still a further embodiment, in the above method, the second gap is a minimum gap that is formed by an etch process having the same aspect ratio that is applied to the second layer having the second thickness. In yet another embodiment, the second gap is a minimum gap that is formed by an etch process having an aspect ratio that is applied to the second layer having the second thickness.

In an embodiment, an apparatus includes at least a portion of a semiconductor substrate having a first thickness and patterned to form a moveable mass having an upper surface, and a lower surface; a moving sense electrode coupled to the movable mass forming the first plate of a first capacitance; at least one anchor patterned from the semiconductor substrate and formed adjacent the moving sense electrode, the at least one anchor having an upper surface, a lower surface, and a sidewall that forms the second plate of the first capacitance and spaced by a first gap from the first plate of the first capacitance; a layer of semiconductor material of a second thickness formed overlying one of the upper surface or the lower surface of the moveable mass and the at least one anchor, the layer of semiconductor material patterned to form a first electrode overlying and coupled to the moving sense electrode and forming a first plate of a second capacitance and further patterned to form a second electrode overlying the at least one anchor and forming a second plate of the second capacitance spaced from the first plate of the second capacitance by a second gap that is less than the first gap; wherein a total capacitance is formed that is the sum of the first capacitance and the second capacitance.

In a further embodiment, in the above apparatus the second thickness is less than the first thickness. In still another embodiment, in the above apparatus, the second layer is a polysilicon layer. In a further embodiment, in the above apparatus, a ratio of the first thickness to the first gap is approximately equal to the ratio of the second thickness to the second gap.

Although the example embodiments have been described in detail, it should be understood that various changes, substitutions and alterations can be made herein without departing from the spirit and scope of the application as defined by the appended claims. For example, different materials may be utilized for the conductors, the guard rings, the solder balls, the build up layers, or different methods of formation may be utilized for the various layers of material. These devices, steps and materials may be varied while remaining within the scope of the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. An apparatus, comprising:
   a first moving electrode forming a first plate of a first capacitance and coupled to a moveable mass formed from a first layer of semiconductor material of a first thickness, the moveable mass having an upper and lower surface;
   a first fixed electrode formed from the first layer of semiconductor material spaced from the first moving electrode by a first gap and forming a second plate of the first capacitance;
   a second moving electrode formed from a second layer of semiconductor material having a second thickness less than the first thickness and overlying one of the upper and lower surfaces of the first moving electrode and coupled to the moveable mass, the second moving electrode forming a first plate of a second capacitance; and
   a second fixed electrode formed from the second layer of semiconductor material and overlying the first fixed electrode and coupled to the first fixed electrode, the second fixed electrode forming a second plate of the second capacitance spaced from the first plate of the second capacitance by a second gap that is less than the first gap.

2. The apparatus of claim 1 wherein the first layer of semiconductor material comprises a silicon layer.

3. The apparatus of claim 1 wherein the first layer of semiconductor material comprises a portion of a silicon wafer that is bonded to a carrier wafer.

4. The apparatus of claim 1 wherein the first layer of semiconductor material and the second layer of semiconductor material comprise a same material.

5. The apparatus of claim 4 wherein the semiconductor material comprises silicon.

6. The apparatus of claim 1 wherein the first layer of semiconductor material comprises a polysilicon layer of the first thickness.

7. The apparatus of claim 1 wherein the second layer comprises a polysilicon layer.

8. The apparatus of claim 1 further comprising conductive vias coupling the second layer to the first layer.

9. The apparatus of claim 1 wherein the first layer of semiconductor material comprises a silicon layer and the second layer of semiconductor material comprises a polysilicon material.

10. The apparatus of claim 1 wherein a ratio of the first thickness to the first gap is approximately equal to a ratio of the second thickness to the second gap.

11. A method, comprising:
    providing a first layer of semiconductor material having a first thickness;
    patterning a moveable mass from the first layer of semiconductor material and coupled to supports configured to allow the moveable mass to move in at least one direction, the moveable mass having an upper surface, a lower surface, and at least one portion having a first sidewall forming a first plate of a first capacitance;
    patterning at least one anchor from the first layer of semiconductor material and forming a second sidewall adjacent to the first sidewall of the moveable mass, the second sidewall forming a second plate of the first capacitance and spaced from the first plate of the first capacitance by a first gap formed by a first etching process;
    depositing a second layer of semiconductor material having a second thickness overlying one of the upper and lower surfaces of the moveable mass and the at least one anchor; and
    forming a first electrode overlying and coupled to the moveable mass and a second electrode overlying and coupled to the at least one anchor by patterning the second layer of semiconductor material, the first electrode configured to move with the moveable mass and forming a first plate of a second capacitance, and the second electrode coupled to the at least one anchor and forming a second plate of the second capacitance, the first and second plates of the second capacitance spaced by a second gap that is formed by a second etching process of the second layer; and wherein the second gap is less than the first gap.

12. The method of claim 11 wherein providing the first layer comprises providing a silicon layer.

13. The method of claim 11 wherein providing the second layer comprises depositing a polysilicon layer over the first layer.

14. The method of claim 11, wherein the first gap is a minimum gap that can be formed for the first layer having the first thickness using the first etching process.

15. The method of claim 14, wherein the second gap is a minimum gap that can be formed for the second layer having the second thickness using the second etching process.

16. The method of claim 11, wherein a ratio of the first thickness to the first gap is approximately equal to a ratio of the second thickness to the second gap.

17. An apparatus, comprising:
at least a portion of a semiconductor substrate having a first thickness and patterned to form a moveable mass having an upper surface, and a lower surface;
a first moving sense electrode coupled to the moveable mass forming a first plate of a first capacitance;
at least one first fixed sense electrode patterned from the semiconductor substrate and formed adjacent the moving sense electrode, the at least one first fixed sense electrode having an upper surface, a lower surface, and a sidewall that forms a second plate of the first capacitance and spaced by a first gap from the first plate of the first capacitance;
a layer of semiconductor material of a second thickness formed overlying the moveable mass or overlying the at least one first fixed sense electrode, the layer of semiconductor material patterned to form a second moving sense electrode overlying and coupled to the moving sense electrode and forming a first plate of a second capacitance and further patterned to form a second fixed sense electrode overlying the at least one first fixed sense electrode and forming a second plate of the second capacitance spaced from the first plate of the second capacitance by a second gap that is less than the first gap; and
wherein a total capacitance is formed that is the sum of the first capacitance and the second capacitance.

18. The apparatus of claim 17, wherein the second thickness is less than the first thickness.

19. The apparatus of claim 17, wherein the layer comprises a polysilicon layer.

20. The apparatus of claim 17, wherein a ratio of the first thickness to the first gap is approximately equal to the ratio of the second thickness to the second gap.

* * * * *